(12) United States Patent
Yukawa

(10) Patent No.: US 7,605,615 B2
(45) Date of Patent: Oct. 20, 2009

(54) VOLTAGE COMPARATOR CIRCUIT

(75) Inventor: Akira Yukawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 361 days.

(21) Appl. No.: 11/218,529

(22) Filed: Sep. 6, 2005

(65) Prior Publication Data

US 2006/0049853 A1    Mar. 9, 2006

(30) Foreign Application Priority Data

Sep. 7, 2004    (JP) .............................. 2004-260200

(51) Int. Cl.
*G11C 7/00* (2006.01)
*G01R 19/00* (2006.01)
*H03F 3/45* (2006.01)

(52) U.S. Cl. .............................. 327/54; 327/55; 327/57; 327/67

(58) Field of Classification Search .................. 327/63, 327/65, 66, 67, 72, 73, 74, 77, 54, 55, 87, 327/541, 543, 50
See application file for complete search history.

(56) References Cited

U.S. PATENT DOCUMENTS

| 5,600,269 A | 2/1997 | Song et al. |
| 6,417,699 B1 | 7/2002 | Barnes |
| 7,049,853 B2 * | 5/2006 | Wang .......................... 327/51 |

FOREIGN PATENT DOCUMENTS

| JP | 2-34490 | 8/1990 |
| WO | WO 03/075461 A2 | 9/2003 |

OTHER PUBLICATIONS

G.M. Yin et al., "A High-Speed CMOS Comparator with 8-b Resolution," (USA), IEEE Journal of Solid-State Circuits, vol. 27, No. 2, Feb. 1992, pp. 208-211.
European Search report dated Jan. 17, 2006.

* cited by examiner

*Primary Examiner*—Lincoln Donovan
*Assistant Examiner*—Daniel Rojas
(74) *Attorney, Agent, or Firm*—McGinn IP Law Group, PLLC

(57) ABSTRACT

There is provided a voltage comparator circuit with even lower power consumption. It comprises an FET Q1, to the gate of which a signal input terminal IN1 is connected, an FET Q2, to the gate of which a signal input terminal IN2 is connected, a bistable circuit, an AND circuit G, and an FET Q11. A pulse signal φ, which becomes a strobe signal for the comparison, is supplied to the bistable circuit, and when the pulse signal φ is at a low level, the logic values of output terminals OUT1 and OUT2 go to a high level, and the output of the AND circuit G becomes high, turning the FET Q11 on. When the pulse signal φ changes to a high level from a low level, input voltages are compared, one of the output terminals OUT1 or OUT2 changes to a low level, corresponding to the value relationship between the drain currents of the FETs Q1 and Q2, and the output of the AND circuit G goes to a low level, turning the FET Q11 off. The power consumption is reduced because the source currents of the FETs Q1 and Q2 flow only during a short period of time when the operation of comparison is being performed.

5 Claims, 7 Drawing Sheets

VOLTAGE COMPARATOR CIRCUIT

FIELD OF THE INVENTION

The present invention relates to a voltage comparator circuit, and especially to a voltage comparator circuit with low power consumption.

BACKGROUND OF THE INVENTION

In recent years, the reduction of power consumption has become a big issue for various kinds of electronic devices represented by mobile terminals as they offer more functions and higher performances, increasing the number of circuits meanwhile the demand for small and light devices also increases. Voltage comparator circuit is widely used as functional circuit block of various kinds of electronics devices. Especially, it is often used in a circuit that converts an analog signal into a digital signal i.e., analog-to-digital converter circuit. Reducing the power consumption of such a voltage comparator circuit is also an issue and it has been performed by some special circuit designs.

For instance, a voltage comparator circuit with low power consumption is disclosed in Patent Document 1. This circuit is constituted by a voltage comparator circuit comprising double flip-flop circuits (double latch-type) shown in FIG. 7. Hereinafter, this circuit will be described in detail.

In FIG. 7, the voltage comparator circuit comprises a first flip-flop circuit constituted by a pair of cross-connected n-type field effect transistors (FET hereinafter) Q103 and Q104, n-type FET Q101 whose source and drain are connected to source and drain of FET Q103 respectively, and, n-type FET Q102 whose source and drain are connected to source and drain of FET Q104 respectively. It also comprises a second flip-flop circuit constituted by a pair of cross-connected p-type FETs Q105 and Q106 with a different polarity from that of the first flip-flop circuit, p-type FET Q107 whose source and drain are connected to source and drain of FET Q105 respectively, p-type FET Q108 whose source and drain are connected to source and drain of FET Q106 respectively, and n-type FETs Q109 and Q110 whose source and drain are connected between the drain of the FETs Q103 and Q104 and the drain of the FETs Q105 and Q106 respectively. The gates of FETs Q107, Q108, Q109 and Q110 are connected in common, to which a pulse signal (strobe signal) φ is supplied. The gates of the FETs Q101 and Q102 are connected to signal input terminals IN1 and IN2 respectively and voltages to be compared are inputted. Furthermore, the drains of the FETs Q109 and Q110 are connected to output terminals OUT2 and OUT1 respectively. The source of the FETs Q101, Q102, Q103, and Q104 are connected to a low-potential power supply VSS, and the source of the FETs Q105, Q106, Q107, and Q108 are connected to a high-potential power supply VDD.

The operation of the voltage comparator circuit with the structure as described above will be explained. In this circuit, the pulse signal φ starts with a low level (the potential of the power supply VSS) first. In the case where the voltage of the power supply VDD is 5V and the threshold voltage of the n-type FET is 0.8V, the circuit will operate at its highest speed if an input voltage is approximately 1V higher than the threshold voltage of the FETs Q101 and Q102. The following explanation will be given assuming the above conditions. Since the FETs Q101 and Q102 are conducted, the drain voltage of the FETs Q103 and Q104 is zero (the potential of the power supply VSS), and since the FETs Q109 and Q110 are not conducted and the FETs Q107 and Q108 are conducted, the potentials of the output terminals OUT1 and OUT2 are equal to the voltage of the power supply VDD (high level).

Next, if a pulse that makes the pulse signal φ high level (the potential of the power supply VDD) is applied, the FETs Q109 and Q110 will be conducted, the FETs Q107 and Q108 will not be conducted, and a current will flow into the flip-flop circuit of the FETs Q103 and Q104 via the FETs Q109 and Q110. At this time, if the potential of the input signal terminal IN1 is higher than that of the input signal terminal IN2, more current will flow in the FET Q101 than in the FET Q102. No drain current will flow in the FETs Q103 and Q104 until the drain potential of either the FET Q103 or FET Q104 exceeds the threshold voltage. When the FETs Q109 and Q110 are conducted, at first, both the drain of the FET Q103 and the drain of the FET Q104 are similarly charged, however, the drain of the FET Q104 (the gate of the FET Q103) exceeds the threshold voltage first since the drain of the FET Q103 has a greater amount of discharge. Then, the FET Q103 starts to discharge, and the potential of the drain of the FET Q103 (the gate of the FET Q104) does not increase. Therefore, the potential of the drain of the FET Q104 continues to increase. Because of this, more current flows in the FET Q109 than in the FET Q110. Then, the flip-flop circuit of the FET Q105 and Q106 operates since the potential of the output terminal OUT2 gets lower than that of the output terminal OUT1, and the potential of the output terminal OUT2 decreases rapidly. As described above, the state of the output terminal is determined according to the potential of the input terminal.

As described, the voltage comparator circuit is constituted by double flip-flop circuits and it has high-speed operation in terms of determining the output condition. Further, since it has a complete symmetrical structure from the input to output, it eliminates the cause of offset voltage, and because power supply noise is applied to the both input voltages, it is canceled out thus eliminating the possibility of malfunctioning due to noise. Furthermore, since it does not consume any current in the initial state (the pulse signal φ is at a low level) and it only consumes a small amount of current during the operation of comparison (the pulse signal φ is at a high level), a voltage comparator circuit with low power consumption can be realized.

Also, another voltage comparator circuit with low power consumption is described in Non-Patent Document 1. This circuit has a structure nearly identical to that of the voltage comparator circuit described in Patent Document 1 except that its input stage is constituted by differential amplifiers of p-type FETs.

[Patent Document 1]

Japanese Patent Kokoku Publication No. JP-02-34490-B2 (FIG. 4)

[Non-Patent Document 1]

G. M. Yin et al., "A High-Speed CMOS Comparator with 8-b Resolution," (USA), IEEE Journal of Solid-State Circuits, Vol. 27, No. 2, February 1992, pp. 208-211.

SUMMARY OF THE DISCLOSURE

The conventional voltage comparator circuit does not consume any current in the initial state (the pulse signal φ is at a low level), however, it consumes a small amount of current during the operation of comparison (the pulse signal φ is at a high level). In FIG. 7, let's assume that the pulse signal φ is at a high level and the potential of the signal input terminal IN1 is higher than that of the signal input terminal IN2. In this state, the FETs Q104, Q105, Q107, and the FET Q108 are turned off while the FETs Q103, Q106, Q109, and the FET Q110 are turned on. Therefore, a small amount of current flows in the FETs Q106, Q110, and Q102. Meanwhile, when the potential of the signal input terminal IN2 is higher than that of the signal input terminal IN1, a small amount of current flows in the FETs Q105, Q109, and Q101. This small amount of current is required to amplify the signal during the operation of comparison and it continues to flow even after the output condition has been determined. However, this current has been thought to be necessary and unavoidable in the conventional circuit and left alone for a long time. Up to the present, no attempt has been made to eliminate this current and create a voltage comparator circuit with even lower power consumption.

Therefore, it is an object of the present invention to provide a voltage comparator circuit with even lower power consumption.

The present inventor achieved the present invention by realizing that the current that flows in the FET Q101 or Q102 is not absolutely necessary after the output condition of the voltage comparator circuit has been determined and the power consumption can be reduced by eliminating this current.

According to one aspect of the present invention, there is provided a voltage comparator circuit comprising a first FET, to the gate electrode of which a first signal input terminal is connected, and a second FET, to the gate of which a second signal input terminal is connected, and a source electrode of which is connected to a source electrode of the first FET. It also comprises a bistable circuit configured such that when a clock signal is supplied and the clock signal is at a first logic value, the logic value of a first output terminal and the logic value of a second output terminal are identical, and when the clock signal changes to a second logic value from the first logic value, either the logic value of the first output terminal or the logic value of the second output terminal changes to a different logic value corresponding to the value relationship between the drain current of the first FET and the drain current of the second FET. Furthermore, it comprises a current control circuit that lets the source currents of the first and second FETs flow when the logic value of the first output terminal and the logic value of the second output terminal are identical, and that cuts off the source currents when the logic value of the first output terminal and the logic value of the second output terminal are different from each other.

In the voltage comparator circuit of a first development form, it is preferable that the current control circuit control so that the source currents of the first and second FETs flow when the logic value of the first output terminal and the logic value of the second output terminal are identical and the clock signal is at the second logic value.

In the voltage comparator circuit of a second development form, it is preferable that the current control circuit comprise a logic circuit that outputs the first logic value when the logic value of the first output terminal and the logic value of the second output terminal are identical, and that outputs the second logic value when the logic value of the first output terminal and the logic value of the second output terminal are different from each other, and a switch element that turns on when the logic circuit outputs the first logic value, and turns off when the logic circuit outputs the second logic value, and the source current flow when the switch element is on and be cut off when it is off.

In the voltage comparator circuit of a third development form, it is preferable that, when the logic value of the first output terminal and the logic value of the second output terminal are identical and the clock signal is at the second logic value, the logic circuit output the first, logic value.

In the voltage comparator circuit of a fourth development form, it is preferable that the source electrodes of the first and second FETs be connected in common to a power supply of the voltage comparator circuit via the switch element.

In the voltage comparator circuit of a fifth development form, it is preferable that the source electrodes of the first and second FETs be connected in common to a power supply of the voltage comparator circuit via a constant current source, and the switch element turn on/off the current of the constant current source.

In the voltage comparator circuit of a sixth development form, it is preferable that the bistable circuit comprise a first flip-flop circuit including a pair of cross-connected third and fourth FETs of a first conductivity type, a second flip-flop circuit including a pair of cross-connected fifth and sixth FETs of a second conductivity type, seventh and eighth FETs of a second conductivity type that share common source electrode and drain electrode with the fifth and sixth FETs respectively, and ninth and tenth FETs of a first conductivity type whose source electrode and drain electrode are connected between the drain electrodes of the third and fourth FETs and the drain electrodes of the fifth and sixth FETs respectively, the drain electrodes of the first and second FETs be connected to the drain electrodes of the third and fourth FETs respectively, the seventh, eighth, ninth, and tenth FETs share a common gate electrode, to which the clock signal is supplied, the source electrodes of the third and fourth FETs be connected to a first power supply, and the source electrodes of the fifth, sixth, seventh, and eighth FETs be connected to a second power supply.

In the voltage comparator circuit of a seventh development form, it is preferable that the first and second FETs be FETs of a first conductivity type, their source electrodes be connected in common to the first power supply via the switch element, and the current control circuit include the switch element and control the source current by turning on/off the switch element.

In the voltage comparator circuit of a eighth development form, it is preferable that the first and second FETs be FETs of a first conductivity type, their source electrodes be connected in common to the first power supply via the constant current source, and the current control circuit control the source current by controlling the current flowing in the constant current source.

In the voltage comparator circuit of a ninth development form, it is preferable that the first and second FETs be FETs of a second conductivity type, their source electrodes be connected in common to the second power supply via the constant current source, and the current control circuit control the source current by controlling the current flowing in the constant current source.

The meritorious effects of the present invention are summarized as follows.

According to the present invention, a voltage comparator circuit with very low power consumption can be realized because it is structured so that the source currents of FETs of an input stage flow only during a short period of time when the operation of comparison is being performed.

PREFERRED EMBODIMENTS OF THE INVENTION

A voltage comparator circuit relating to an embodiment of the present invention comprises a first FET (Q1 in FIG. 1), to the gate of which a first signal input terminal (IN1 in FIG. 1) is connected, a second FET (Q2 in FIG. 1), to the gate of which a second signal input terminal (IN2 in FIG. 1) is connected, double bistable circuits, and a current control circuit. The bistable circuits are structured so that when a pulse signal (φ in FIG. 1), which becomes a strobe signal for the comparison, is supplied and the pulse signal is at a low level, the logic value of a first output terminal (OUT1 in FIG. 1) and the logic value of a second output terminal (OUT2 in FIG. 1) go to a high level, and when the pulse signal changes to a high level from a low level, either the first output terminal or the second output terminal changes to a low level corresponding to the value relationship between the drain current of the first FET and the drain current of the second FET.

Figure 1:
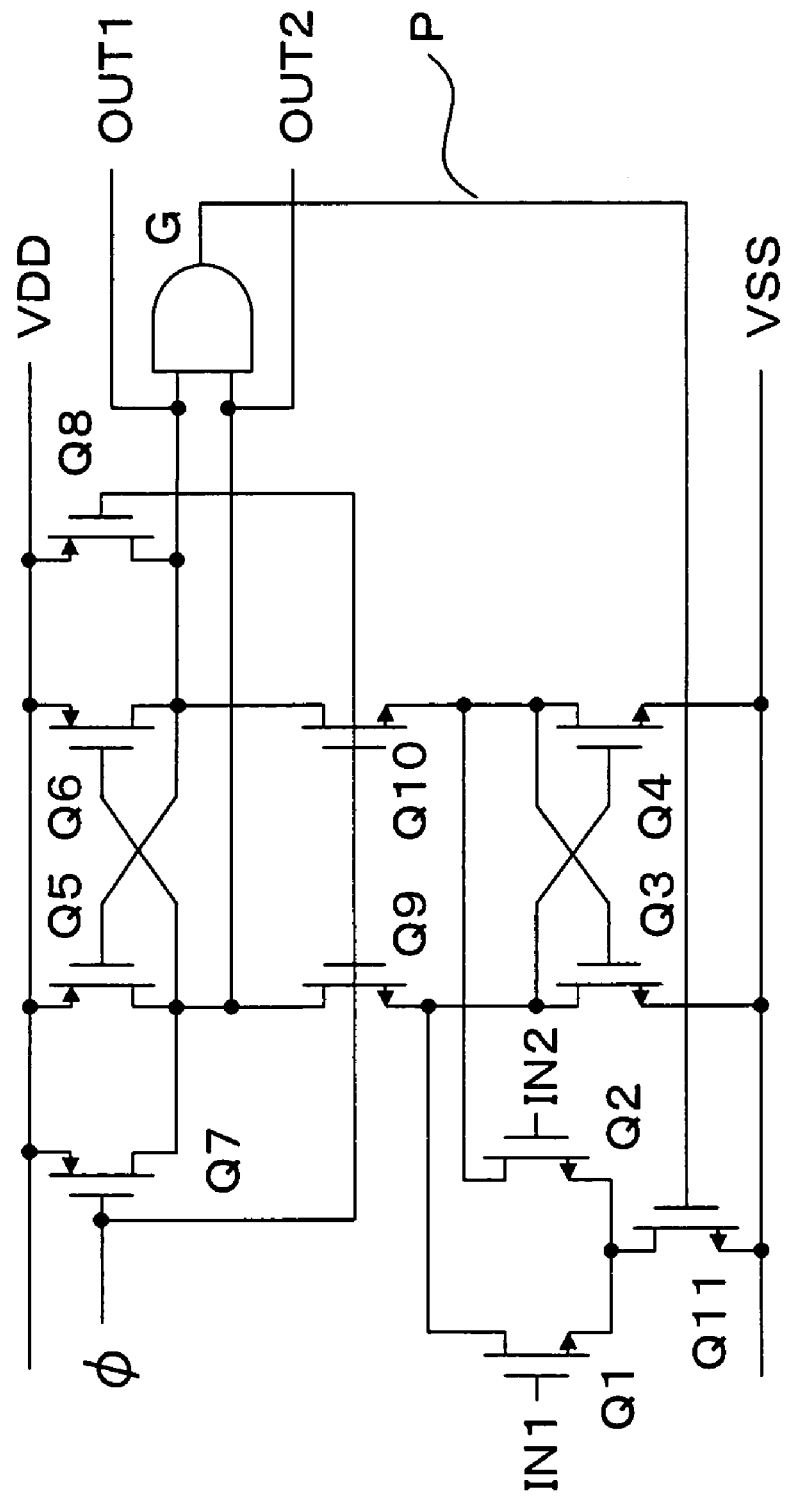
FIG. 1 is a circuit diagram illustrating the structure of the voltage comparator circuit relating to the first embodiment of the present invention.

The current control circuit comprises a logic circuit (G in FIG. 1) and a switch element (FET Q11 in FIG. 1). The logic circuit outputs a high level when the logic values of the first and second output terminals are at a high level, and it outputs a low level when either the first or second output terminal goes to a low level. Furthermore, the switch element is turned on when the logic circuit outputs a high level and it is turned off when the logic circuit outputs a low level. The source currents of the first FET and the second FET flow when the switch element is on, and they are cut off when it is off.

In the voltage comparator circuit structured as described above, when the pulse signal changes to a high level from a low level, either the first output terminal or the second output terminal changes to a low level corresponding to the value relationship between the drain current of the first FET and the drain current of the second FET. Then, the logic circuit outputs a low level, and the switch element is turned off, cutting off the source currents of the first FET and the second FET. In other words, the source currents of the first FET and the second FET flow only during a short period of the comparison operation, and since these source currents are cut off after the output condition has been determined by the comparison, the power consumption of the voltage comparator circuit can be very low.

Embodiment 1

Next, an embodiment of the voltage comparator circuit will be described. FIG. 1 is a circuit drawing illustrating the structure of the voltage comparator circuit relating to the first embodiment of the present invention. In FIG. 1, FETs Q1, Q2, Q3, Q4, Q5, Q6, Q7, Q8, Q9, and Q10 correspond to the FETs Q101, Q102, Q103, Q104, Q105, Q106, Q107, Q108, Q109, Q110 in the conventional voltage comparator circuit shown in FIG. 7, therefore, the explanations for them will be omitted. However, the source electrodes of FETs Q1 and Q2 are connected in common to the drain electrode of the n-type FET Q11. Furthermore, the source electrode of the n-type FET Q11 is connected to a low-potential power supply VSS. The inputs of the logic circuit are the output terminals OUT1 and OUT2, and the logic circuit is constituted by a two-input AND gate G whose output P is connected to the gate electrode of the FET Q11.

Figure 2:
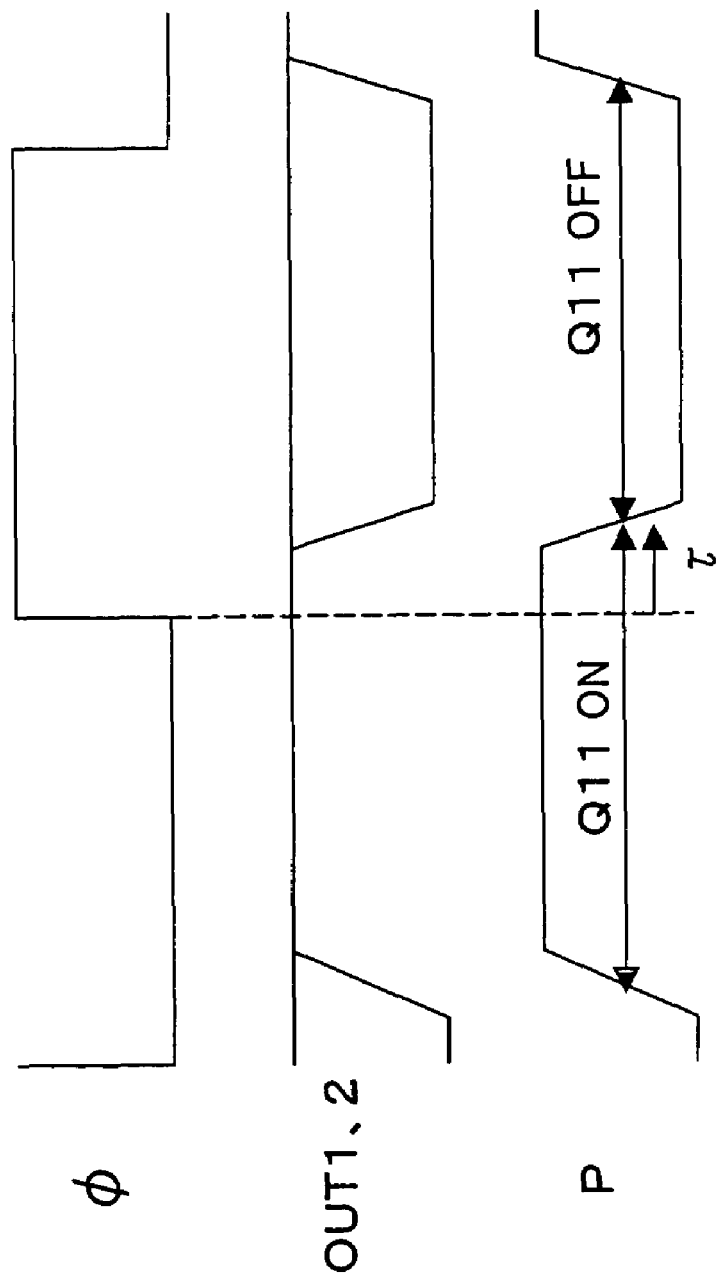
FIG. 2 is a time chart explaining the operation of the voltage comparator circuit relating to the first embodiment of the present invention.

Next, the operation of the voltage comparator circuit structured as above will be described. FIG. 2 is a time chart explaining the operation of the voltage comparator circuit relating to the first embodiment of the present invention. When the pulse signal φ, which is the strobe signal for the comparison, is at a low level (the potential of the power supply VSS), the FETs Q7 and Q8 are conducted and the potentials of the output terminals OUT1 and OUT2 are equal to the voltage of a power supply VDD (high level). Therefore, the output P of the AND gate G goes to a high level, the FET Q11 is turned on, and the FETs Q1 and Q2 are conducted.

Figure 7:
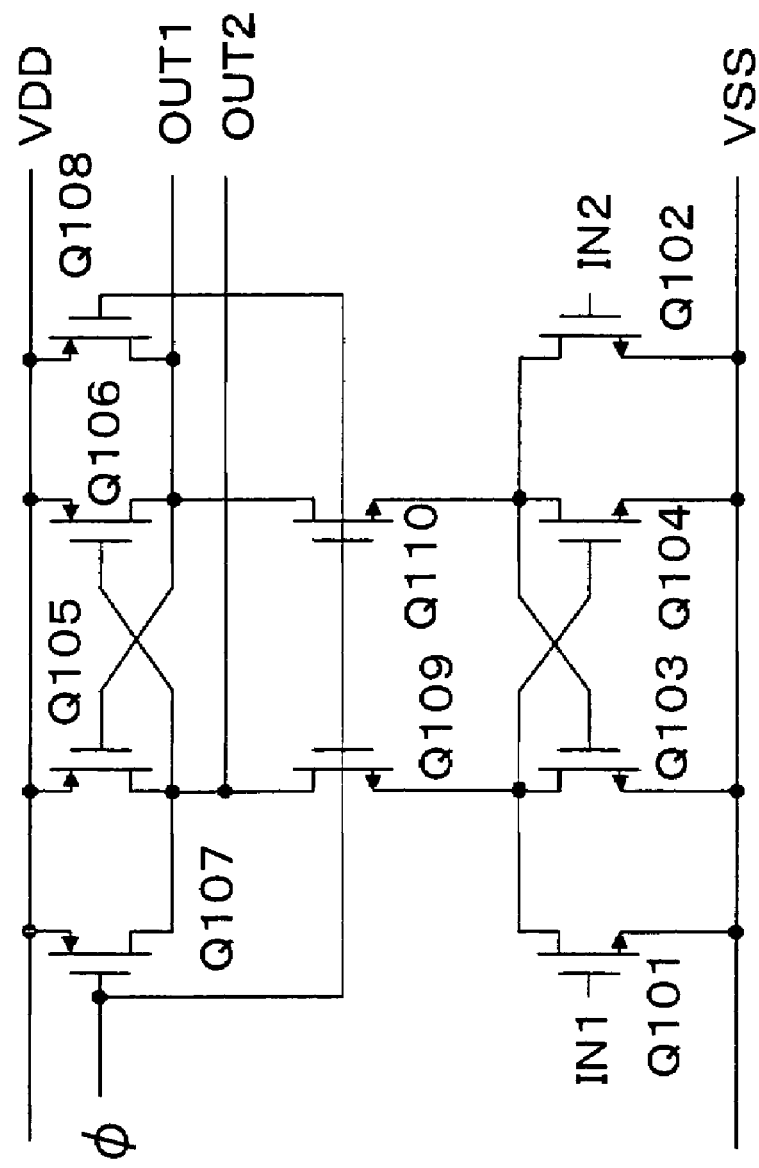
FIG. 7 is a circuit diagram illustrating the structure of the conventional voltage comparator circuit.

When the pulse signal φ changes to a high level from a low level, as in the description on the operation of the conventional voltage comparator circuit shown in FIG. 7, either the output terminals OUT1 or OUT2 changes to a low level, corresponding to the voltage difference supplied to the input terminals IN1 and IN2. For instance, when the potential of the input terminal IN1 is higher than that of the input terminal IN2, the output terminal OUT2 changes to a low level, and when the potential of the input terminal IN2 is higher than that of the input terminal IN1, the output terminal OUT1 changes to a low level. Because of this, the output P of the AND gate G changes to a low level from a high level, and the FET Q11 is turned off, cutting off the source currents of the FETs Q1 and Q2. Further, the output P becomes a control signal indicating whether or not the comparison result has been determined, and can be efficiently utilized in an external circuit using the voltage comparator circuit.

Because the voltage comparator circuit operates as described above, the source currents of the FETs Q1 and Q2 flow only during a very short period of time τ when the operation of comparison is being performed. After the output condition has been determined by the comparison, the FET Q11 continues to be off and cut off the source currents of the FETs Q1 and Q2. Normally, the voltage comparator circuit operates with the pulse signal φ, which is the strobe signal for the comparison, having a duty of 50%. Therefore, the average current consumption is a half of the source currents of the FETs Q1 and Q2. However, the comparison time τ is as short as, for example, approximately 1 ns, and, for instance, if the pulse signal φ has a cycle of 50 ns (the comparison is performed in a cycle of 50 ns), the current consumption will flow for a period of 1 n in the present invention as opposed to 25 ns in the conventional technology, reducing the current consumption by approximately 1/25 compared to the conventional technology. In other words, the power consumption of a voltage comparator circuit can be greatly reduced.

Embodiment 2

Figure 3:
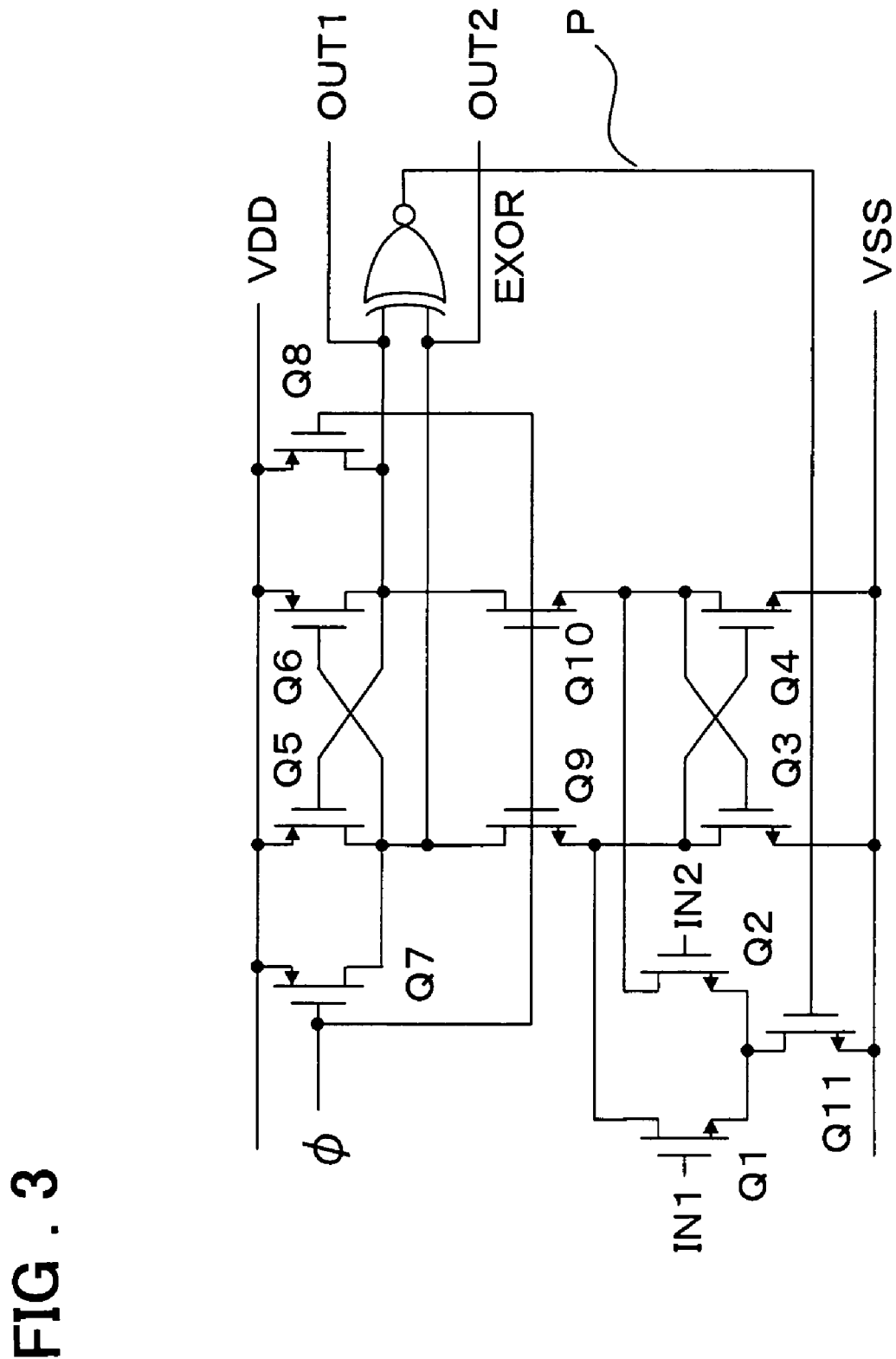
FIG. 3 is a circuit diagram illustrating the structure of the voltage comparator circuit relating to the second embodiment of the present invention.

FIG. 3 is a circuit diagram illustrating the structure of a voltage comparator circuit relating to a second embodiment of the present invention. In FIG. 3, an exclusive-OR circuit EXOR with a NOT logic in its output is used instead of the AND gate G in FIG. 1. Other than that, the structure is identical to FIG. 1. When the output terminals OUT1 and OUT2 are at a high level, the output P of the exclusive-OR circuit EXOR is also at a high level, and when one of the output terminals OUT1 or OUT2 is at a low level, the output P of the exclusive-OR circuit EXOR is also at a low level. When both of the output terminals OUT1 and OUT2 are at a low level, the output P of the AND gate G in FIG. 1 is at a low level, and the output P of the exclusive-OR circuit EXOR in FIG. 3 goes to a high level. However, in the embodiments of the present invention, since there is no case where the both output terminals OUT1 and OUT2 are at a low level, the second embodiment operates exactly as the first embodiment. Meanwhile, instead of the AND gate G or the exclusive-OR circuit EXOR, various logic circuits that outputs a high level when the output terminals OUT1 and OUT2 are at a high level, and outputs a low level when one of the output terminals OUT1 or OUT2 is at a low level can be used.

Embodiment 3

Figure 4:
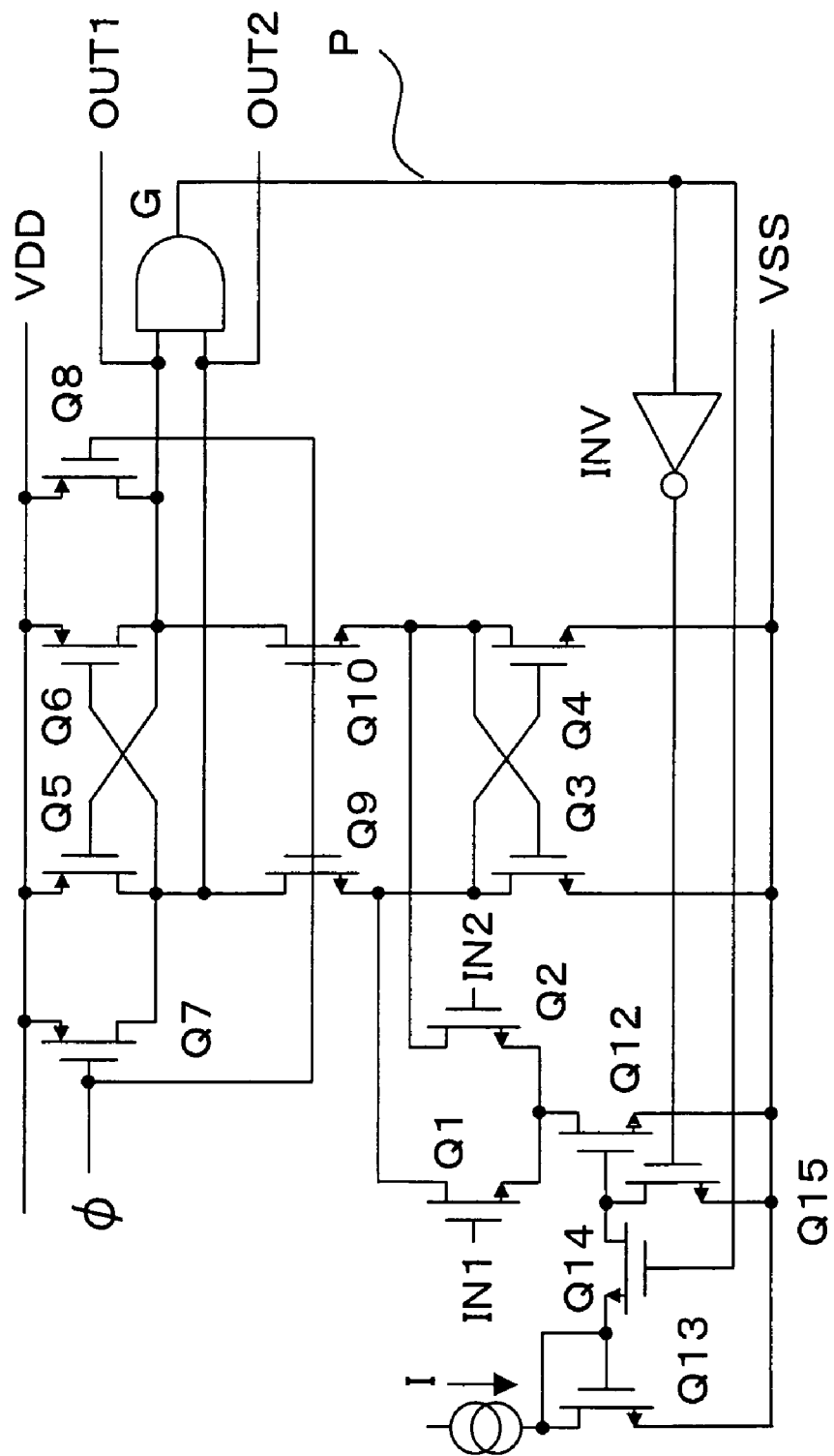
FIG. 4 is a circuit diagram illustrating the structure of the voltage comparator circuit relating to the third embodiment of the present invention.

FIG. 4 is a circuit diagram illustrating the structure of a voltage comparator circuit relating to a third embodiment of the present invention. In FIG. 4, the same symbols as the ones in FIG. 1 mean that they are identical to or correspond to the ones in FIG. 1, and the explanation for them will be omitted. The drain electrode of an n-type FET Q12 is connected in common with the source electrode of the FETs Q1 and Q2, and the source electrode of the FET Q12 is connected to the low potential power supply VSS. The drain electrode and gate electrode of an n-type FET Q13 are connected in common to a constant current source I, and the source electrode is connected to the low potential power supply VSS. The drain electrode of an n-type FET Q14 is connected to the drain electrode of an n-type FET Q15, and the gate electrode of the n-type FET Q12, and the source electrode of the n-type FET Q14 is connected to the drain electrode of the n-type FET Q13. The drain electrode of the n-type FET Q15 is connected to the drain electrode of the FET Q14 and the gate electrode of the FET Q12, and the source electrode of the n-type FET Q15 is connected to the low potential power supply VSS.

Further, the output P of the AND gate G is connected to the gate electrode of the FET Q14 and an inverter circuit INV, and a signal logically inverted by the inverter circuit INV is supplied to the gate electrode of the FET Q15.

In the voltage comparator circuit structured as described above, when the output P is at a high level, the FET Q14 is turned on while the FET Q15 is turned off. A bias voltage generated by the constant current source I and the FET Q16 is supplied to the gate electrode of the FET Q12 via the FET Q14 turned on, and the FET Q12 operates as a constant current source. The FETs Q1 and Q2 comprise an input stage of the comparator circuit in which the two source electrodes of the FETs Q1 and Q2 are connected to this constant current source.

On the other hand, when the output P is at a low level, the FET Q14 is turned off while the FET Q15 is turned on. Because of this, the FET Q12 is also turned off, cutting off the source currents of the FETs Q1 and Q2.

In the voltage comparator circuit relating to the third embodiment, as in the first embodiment, the source currents of the FETs Q1 and Q2 flow via the constant current source of the FET Q12 only during a very short period of the comparison operation. After the output condition has been determined by the comparison, the FET Q12 is turned off and continues to cut off the source currents of the FETs Q1 and Q2, therefore the power consumption of the voltage comparator circuit can be very low. Furthermore, since the FETs Q1 and Q2 operate as a differential amplifier having the FET Q12 as its constant current source during the operation of comparison, this voltage comparator circuit can have a wider range of input voltage for being supplied to the input terminals IN1 and IN2 than the voltage comparator circuit of the first embodiment. Further, the ability to eliminate in-phase noise components can be increased. Meanwhile, a bias current flows via the constant current source I and the FET Q13 all the time, however, this current is very small and has almost no influence on the power consumption of the voltage comparator circuit.

Embodiment 4

Figure 5:
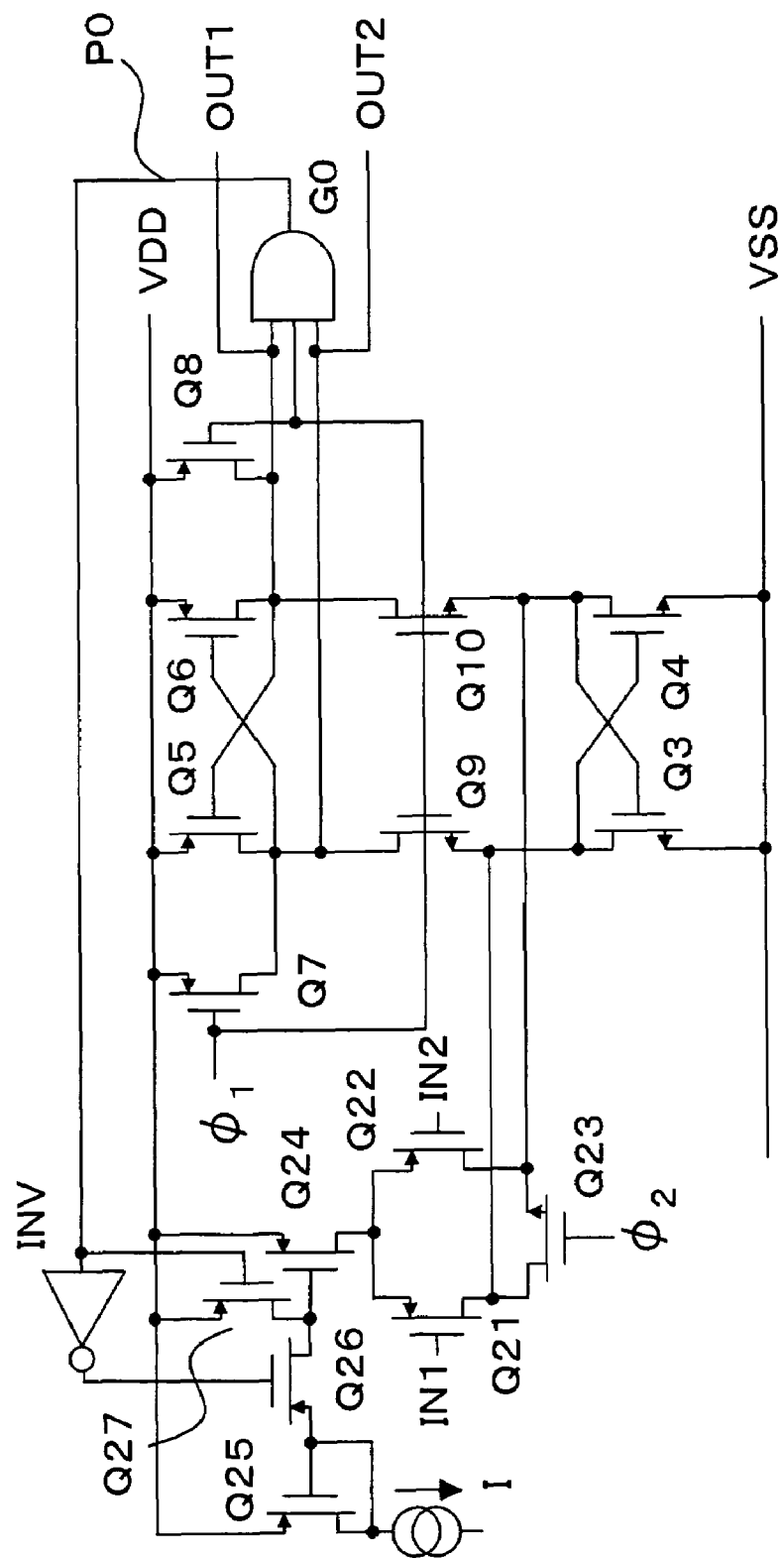
FIG. 5 is a circuit diagram illustrating the structure of the voltage comparator circuit relating to the fourth embodiment of the present invention.

FIG. 5 is a circuit diagram illustrating the structure of a voltage comparator circuit relating to a fourth embodiment of the present invention. The voltage comparator circuit shown in FIG. 5 is structured by applying the present invention to the comparator circuit described in Non-Patent Document 1, reducing the power consumption even more. In FIG. 5, the same symbols as the ones in FIG. 4 mean that they are identical to or correspond to the ones in FIG. 4, therefore the explanation for them will be omitted. In FIG. 5, FETs Q21, Q22, Q24, Q25, Q26, and Q27 correspond to the FETs Q1, Q2, Q12, Q13, Q14, and Q15 respectively, except that they are p-type FETs. The source electrodes of the FETs Q24, Q25 and Q27 are connected to a high potential power supply VDD.

The drain electrode and source electrode of a newly added n-type FET Q23 are connected to the drain electrodes of the FETs Q21 and Q22 respectively, and a clock signal $\phi 2$ is supplied to the gate electrode of the FET Q23. Meanwhile, a clock signal $\phi 1$ corresponds to a clock signal $\phi$ in FIG. 4, and is inputted into a three-input AND gate G0 along with output terminals OUT1 and OUT2. An output P0 of the AND gate G0 is connected to the gate electrode of the FET Q27 and to the input of an inverter circuit INV. The output of the inverter circuit INV is connected to the gate electrode of the FET Q26.

Figure 6:
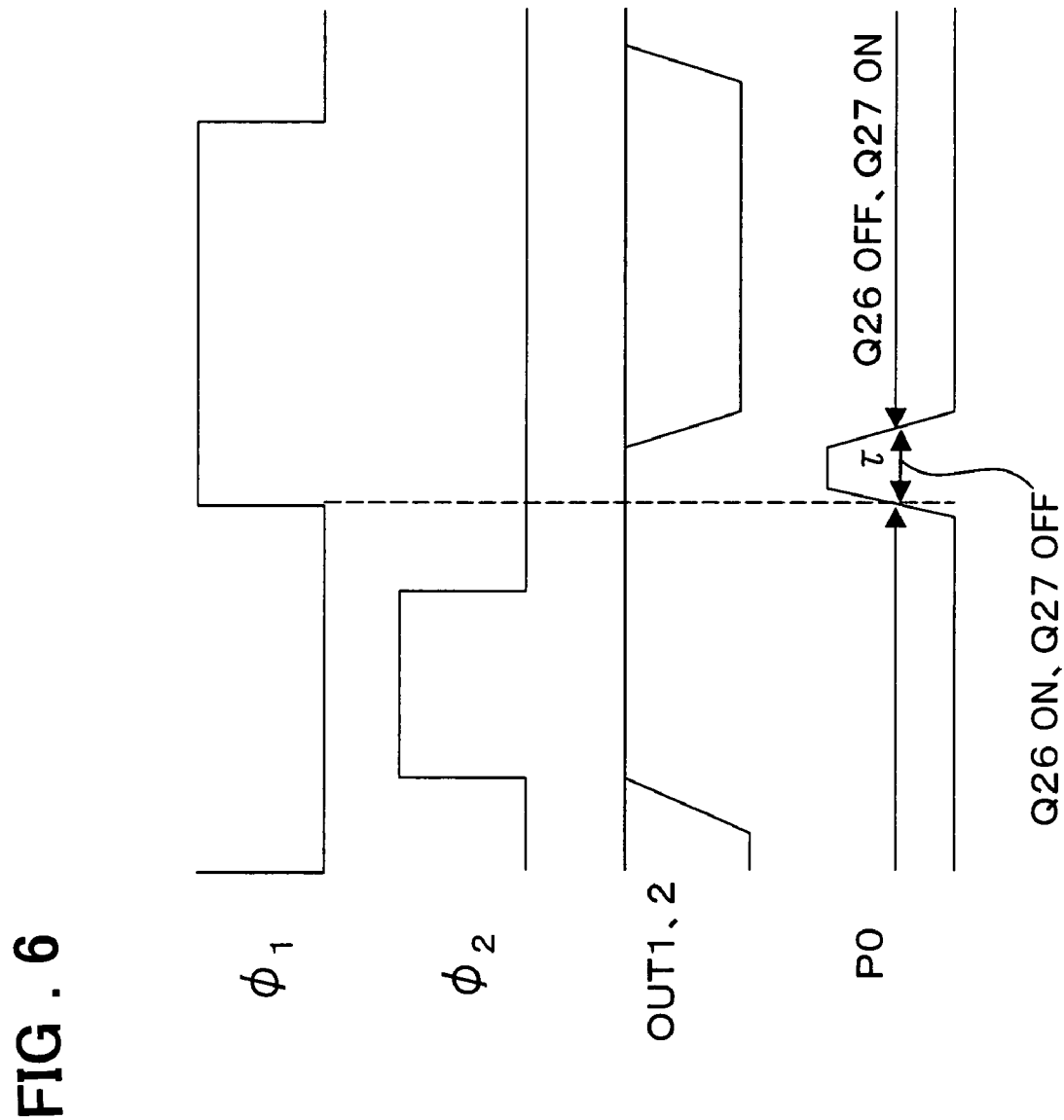
FIG. 6 is a time chart explaining the operation of the voltage comparator circuit relating to the fourth embodiment of the present invention.

Next, the operation of the voltage comparator circuit structured as above will be described. FIG. 6 is a time chart explaining the operation of the voltage comparator circuit relating to the fourth embodiment of the present invention. When the pulse signal $\phi 1$, which is the strobe signal for the comparison, is at a low level (the potential of the power supply VSS), the FETs Q7 and Q8 are conducted and the potentials of the output terminals OUT1 and OUT2 are equal to the voltage of the power supply VDD (high level). Therefore, the output P0 of the AND gate G0 goes to a low level, the FET Q27 is turned on while the FET Q24 is off, and the source currents of the FETs Q21 and Q22 do not flow.

While the pulse signal $\phi 1$ is at a low level, the pulse signal $\phi 2$ is set to a high level (so that the pulse signal $\phi 1$ and the pulse signal $\phi 2$ are not at a high level simultaneously), turning the FET Q23 on. By doing this, the drain potentials of the FETs Q3 and Q4 become identical. In other words, the voltage of the latch stage is balanced. After this, the pulse signal $\phi 2$ is set to a low level, and the FET Q23 is turned off.

Furthermore, when the pulse signal $\phi 1$ changes to a high level from a low level, the output P0 of the AND gate G0 goes to a high level, the FET Q27 is turned off while the FET Q26 is on, and the FET Q24 is turned on and functions as a constant current source. Therefore, the source currents of the FETs Q21 and Q22 flow, as explained in the operation of the conventional voltage comparator circuit shown in FIG. 7, one of the output terminals OUT1 or OUT2 changes to a low level corresponding to the voltage difference supplied to input terminals IN1 and IN2. For instance, when the potential of the input terminal IN1 is higher than that of the input terminal IN2, the output terminal OUT2 changes to a low level, and when the potential of the input terminal IN2 is higher than that of the input terminal IN1, the output terminal OUT1 changes to a low level. Because of this, the output P0 of the AND gate G0 changes to a low level from a high level, and the FET Q27 is turned on while the FET Q24 is off, cutting off the source currents of the FETs Q21 and Q22.

The voltage comparator circuit operates as described above, and the source currents of the FETs Q21 and Q22 flow only during a very short period of time τ when the operation of comparison is being performed. When the operation of comparison is not being performed, the FET Q24 is turned off, cutting off the source currents of the FETs Q21 and 22. Therefore, as in Embodiment 3, the power consumption of the voltage comparator circuit can be reduced greatly. Furthermore, since the FETs Q21 and Q22 operate as a differential amplifier having the FET Q24 as its constant current source, this voltage comparator circuit can have a wider range of input voltage for being supplied to the input terminals IN1 and IN2 than the voltage comparator circuit of the first embodiment. Further, the ability to eliminate in-phase noise components can be increased.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A voltage comparator circuit, comprising:
an amplifier including a constant current input, a first input field effect transistor configured to receive a first input signal and a second input field effect transistor configured to receive a second input signal;
a pulse signal generator configured to output a pulse signal;
a double bistable circuit being configured to receive the pulse signal so that when the pulse signal is at a low level, a first output terminal configured to output a first output signal and a second output terminal configured to output a second output signal both output a high level and when the pulse signal changes to a high level, either one of the first output terminal and the second output terminal changes to a low level corresponding to a value relationship between a drain current of the first input field effect transistor and a drain current of the second input field effect transistor;
a logic circuit configured to receive the first output signal and the second output signal from the double bistable circuit, the logic circuit being configured to supply the amplifier with power when the output is high and to not supply the amplifier with power when the output is low;
a first switch field effect transistor having a drain electrode in common with a source electrode of the first input field effect transistor and a drain electrode in common with a source electrode of the second input field effect transistor, and the source electrode of the first switch field effect transistor being connected to a low potential power supply;
a second switch field effect transistor having a drain electrode and a gate electrode being connected in common to a constant current source and a source electrode thereof being connected to the low potential power supply; and
a third switch field effect transistor having a drain electrode thereof in common with a drain electrode of a fourth switch field effect transistor and the gate electrode of the second field effect transistor, and the source electrode of the third switch field effect transistor being connected to the drain electrode of the second switch field effect transistor, the fourth switch field effect transistor having a drain electrode in common with the drain electrode of the third switch field effect transistor and a drain electrode in common with the sate electrode of the second switch field effect transistor, and a source electrode of the fourth switch field effect transistor being connected to the low potential power supply.

2. The voltage comparator circuit of claim 1, wherein source currents into each of the first and second field effect transistors flow only during a voltage comparison between a first input signal and a second input signal input to the first input field effect transistor and second input field effect transistor, respectively.

3. The voltage comparator circuit of claim 1, wherein a length of time for the voltage comparison is less than a cycle of the pulse signal generator.

4. The voltage comparator circuit of claim 3, wherein the logic circuit comprises an AND gate connected to the gate electrode of a third switch field effect transistor and an inverter circuit configured to invert a signal and to supply the inverted signal to the gate electrode of a fourth switch field effect transistor.

5. A voltage comparator circuit, comprising:
an amplifier including a constant current input, a first input field effect transistor configured to receive a first input signal and a second input field effect transistor configured to receive a second input signal;
a pulse signal generator configured to output a pulse signal;
a double bistable circuit being configured to receive the pulse signal so that when the pulse signal is at a low level, a first output terminal configured to output a first output signal and a second output terminal configured to output a second output signal both output a high level and when the pulse signal changes to a high level, either one of the first output terminal and the second output terminal changes to a low level corresponding to a value relationship between a drain current of the first input field effect transistor and a drain current of the second input field effect transistor; and
a logic circuit configured to receive the first output signal and the second output signal from the double bistable circuit, the logic circuit being configured to supply the amplifier with power when the output is high and to riot supply the amplifier with power when the output is low,
wherein a length of time for the voltage comparison is less than a cycle of the pulse signal generator, and
wherein when the logic circuit outputs the high level, a third switch field effect transistor is turned on while a fourth switch field effect transistor is turned off, such that the first switch field effect transistor operates as a constant current source and when the output of the logic circuit is at a low level, the third switch field effect transistor is turned off while the fourth switch field effect transistor is turned on to turn off the first switch field effect transistor to cut off the source currents of the first input and second input field effect transistors.

* * * * *